United States Patent
Shin

(10) Patent No.: US 7,468,302 B2
(45) Date of Patent: *Dec. 23, 2008

(54) METHOD OF FORMING TRENCH TYPE ISOLATION FILM OF SEMICONDUCTOR DEVICE

(75) Inventor: Hyeon Sang Shin, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/440,532

(22) Filed: May 25, 2006

(65) Prior Publication Data

US 2006/0270184 A1 Nov. 30, 2006

(30) Foreign Application Priority Data

May 25, 2005 (KR) .................. 10-2005-0044145

(51) Int. Cl.
- H01L 21/336 (2006.01)
- H01L 21/76 (2006.01)
- H01L 21/311 (2006.01)

(52) U.S. Cl. .................. 438/296; 438/437; 438/702; 257/E21.545; 257/E21.684

(58) Field of Classification Search .................. 438/296, 438/437, 453, 702, 713, 714; 257/E21.546, 257/E21.545
See application file for complete search history.

(56) References Cited

U.S. PATENT DOCUMENTS

| | | | | |
|---|---|---|---|---|
| 4,635,090 A | * | 1/1987 | Tamaki et al. | 257/513 |
| 4,839,306 A | * | 6/1989 | Wakamatsu | 438/424 |
| 5,891,771 A | * | 4/1999 | Wu et al. | 438/248 |
| 6,040,247 A | * | 3/2000 | Chung | 438/713 |
| 6,596,608 B2 | * | 7/2003 | Saito | 438/424 |
| 7,045,413 B2 | * | 5/2006 | Lee et al. | 438/230 |
| 7,056,647 B2 | * | 6/2006 | Jung et al. | 430/313 |
| 7,183,174 B2 | * | 2/2007 | Park | 438/424 |
| 7,384,846 B2 | * | 6/2008 | Lee | 438/258 |

* cited by examiner

*Primary Examiner*—Walter L Lindsay, Jr.
*Assistant Examiner*—Ron E Pompey
(74) *Attorney, Agent, or Firm*—Marshall, Gerstein & Borun LLP

(57) ABSTRACT

A method of forming a trench type isolation film of a semiconductor device, including the steps of sequentially forming a pad oxide film and a nitride film for a hard mask on a semiconductor substrate in which a cell region and a peri region are defined; patterning the nitride film using an etch process employing a cell array mask; coating a photoresist on the entire structure including the patterned nitride film; patterning the photoresist using a peri ISO mask; sequentially etching the nitride film, the pad oxide film, and the semiconductor substrate using the patterned photoresist as an etch mask, thereby forming first trenches; stripping the photoresist; etching the semiconductor substrate of the cell region and the peri region using the patterned nitride film as an etch mask, thereby forming second trenches in the cell region and third trenches, which are consecutive to the first trenches, in the peri region; and, forming an isolation film within the second and third trenches. The invention can prevent dislocation depending the concentration of stress on micro trenches and can improve field leakage characteristics.

8 Claims, 2 Drawing Sheets

METHOD OF FORMING TRENCH TYPE ISOLATION FILM OF SEMICONDUCTOR DEVICE

BACKGROUND

1. Field of the Invention

The invention relates generally to a method of manufacturing semiconductor devices and, more particularly, to a method of forming a trench type isolation film of a semiconductor device that can improve the leakage characteristic of the isolation film.

2. Discussion of Related Art

If a typical etch process for forming a trench type isolation film is performed, ions can be concentrated on the sidewalls of the trench since electrons are charged on the sidewalls of the trench, or a micro trench may be formed on the sidewalls since the sidewalls are rapidly cooled due to ion scattering.

In a typical etch process for forming a trench type isolation film, an etch barrier layer is formed below a subject film to be etched so that an over-etch process can be carried out. Accordingly, although the micro trench is formed during the etch process, the micro trench can be removed by the over-etch process. It is therefore possible to form a flat bottom profile of the trench.

However, the trench etch process for element isolation employs a partial etch process for etching only a predetermined amount of the subject film. Accordingly, it is impossible to remove the micro trench.

While a series of processes, such as a sidewall oxidation process, a trench burial process employing a high density plasma (HDP) oxide film and an annealing process, which will be performed subsequently, stress is concentrated on the micro trench. The portion of the micro trench causes dislocation, resulting in degraded leakage characteristics of the isolation film.

SUMMARY OF THE INVENTION

In one embodiment, the invention provides a method of forming a trench type isolation film of a semiconductor device, wherein the occurrence of a micro trench in a trench for element isolation can be prevented.

In another embodiment, the invention provides a method of forming a trench type isolation film of a semiconductor device wherein a leakage characteristic of an isolation film can be prevented.

Accordingly, the invention provides a method of forming a trench type isolation film of a semiconductor device, including the steps of sequentially forming a pad oxide film and a nitride film for a hard mask on a semiconductor substrate in which a cell region and a peri region are defined; patterning the nitride film in the cell region using an etch process employing a cell array mask, thereby forming a patterned nitride film; coating a photoresist on the entire structure including the patterned nitride film; patterning the photoresist in the peri region using a peri ISO mask, thereby forming a patterned photoresist; sequentially etching the nitride film, the pad oxide film, and the semiconductor substrate in the peri region using the patterned photoresist as an etch mask, thereby forming first trenches in the peri region; stripping the photoresist; etching the semiconductor substrate of the cell region and the peri region using the patterned nitride film as an etch mask, thereby forming second trenches in the cell region and third trenches, which are consecutive to the first trenches, in the peri region; and forming an isolation film within the second and third trenches.

The invention provides an additional method of forming a trench type isolation film of a semiconductor device, including the steps of forming a nitride film for a hard mask over a semiconductor substrate in which a cell region and a peri region are defined; patterning the nitride film in the cell region to expose the semiconductor substrate using a cell array mask, thereby forming a patterned nitride film; coating a photoresist on the entire structure including the patterned nitride film; patterning the photoresist in the peri region, thereby forming a patterned photoresist; forming first trenches having a lateral slope in the peri region by etching the nitride film, and the semiconductor substrate of the peri region using the patterned photoresist as an etch mask; stripping the photoresist; forming second trenches having a vertical profile in the cell region and third trenches, which are consecutive to the first trenches, in the peri region by etching the semiconductor substrate of the cell region and the peri region using the patterned nitride film as an etch; and forming an isolation film within the second and third trenches.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

The invention will now be described in detail in connection with certain exemplary embodiments with reference to the accompanying drawings.

FIGS. 1A to 1E are cross-sectional views illustrating a method of fabricating a trench type isolation film of a semiconductor device according to an embodiment of the invention.

Figure 1A:
FIGS. 1A to 1E are cross-sectional views illustrating a method of fabricating a trench type isolation film of a semiconductor device according to an embodiment of the invention.
Figure 1A:
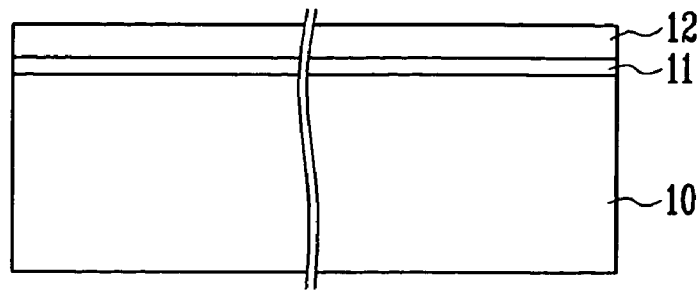

Referring to FIG. 1A, a pad oxide film 11 and a nitride film 12 for a hard mask are sequentially formed on a semiconductor substrate 10 in which a cell region and a peri region are defined.

Figure 1B:
Figure 1B:
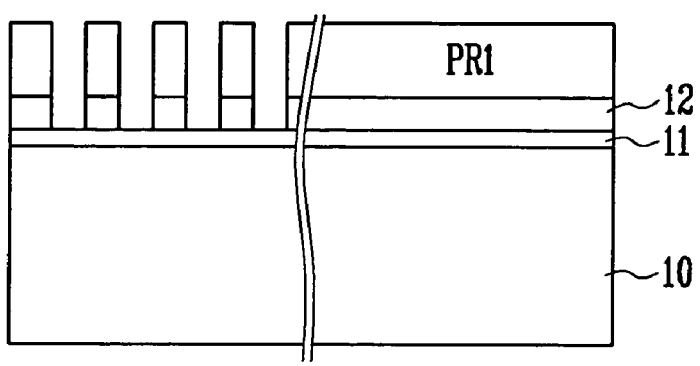

Referring to FIG. 1B, a first photoresist PR1 is coated on the nitride film 12 and is then patterned using a cell array mask. The nitride film 12 is patterned by an etch process using the patterned first photoresist PR1 as an etch mask.

Figure 1C:
Figure 1C:
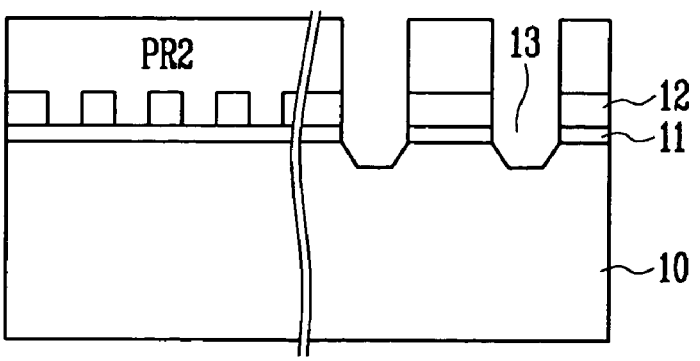

Referring to FIG. 1C, the first photoresist PR1 is stripped, and then a second photoresist PR2 is coated on the entire structure including the patterned nitride film 12. The second photoresist PR2 is patterned using a peri ISO mask. The nitride film 12, the pad oxide film 11, and the semiconductor substrate 10 are sequentially etched using the patterned second photoresist PR2 as an etch mask, thereby forming first trenches 13.

In the foregoing process, the second photoresist PR2 may preferably use a photoresist for KrF and may preferably be formed to a thickness of 3500 Å or more so that the cell region is not attacked in a subsequent etch process. More particularly, the second photoresist PR2 may perferably be formed to have a depth of 1000 Å to 2000 Å taking the difference between the depth of the trenches for element isolation, which are formed in the cell region, and the depth of the trenches for element isolation, which are formed in the peri region, into consideration.

While the semiconductor substrate 10 is etched using the second photoresist PR2 as an etch mask, carbon and hydrogen components of the second photoresist PR2 accelerate the creation of polymer and the created polymer is deposited on the etch sidewalls. Therefore, the first trench 13 has a lateral slope. The slope angle of the first trench 13 can be controlled by adjusting the pressure, power, the etch gas of the etch process, and so on.

The first trenches 13 are formed only in the peri region and not in the cell region, since the cell region has a tight design rule. Therefore, if the slope etch process is performed on the cell region, etch-stop is caused at the bottom portions of the trenches in a notch form. This makes it impossible to form trenches having a desired target depth.

Figure 1D:
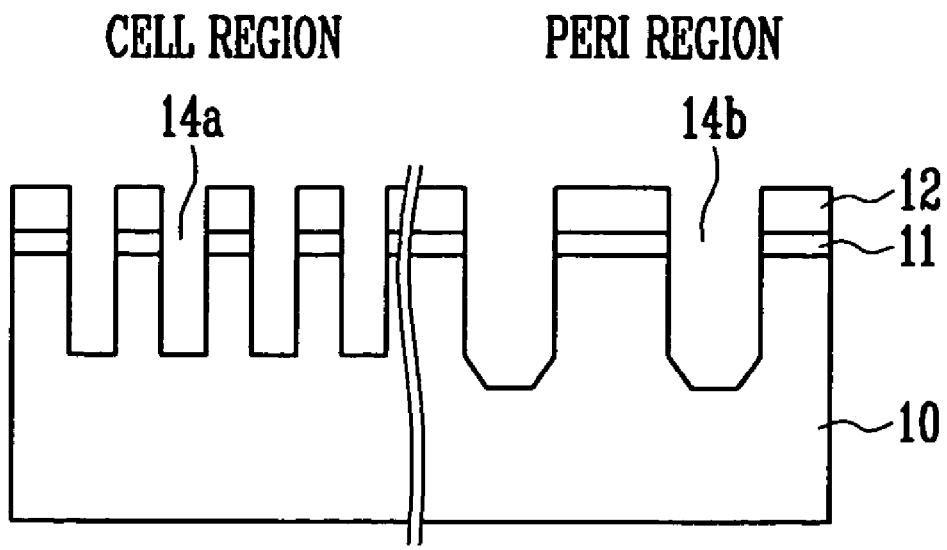

Referring to FIG. 1D, the second photoresist PR2 is stripped and a cleaning process is then carried out. The semiconductor substrate 10 in the cell region and the peri region is etched by a vertical profile trench etch process using the patterned nitride film 12 as an etch mask. Accordingly, second trenches 14a having a first depth are formed in the cell region, and third trenches 14b, which are consecutive to the first trenches 13 and have a second depth deeper than the first depth, are formed in the peri region.

In the foregoing, since the etch process of the second and third trenches 14a and 14b is a process using the nitride film 12 as the etch mask, a polymer is rarely created. Accordingly, trench etch having a vertical profile is possible. Therefore, in the third trenches 14b that are consecutive to the first trenches 13 having a lateral slope, the slope profiles of the first trenches 13 are transferred to the bottom without change, so that micro trenches are not formed.

Figure 1E:
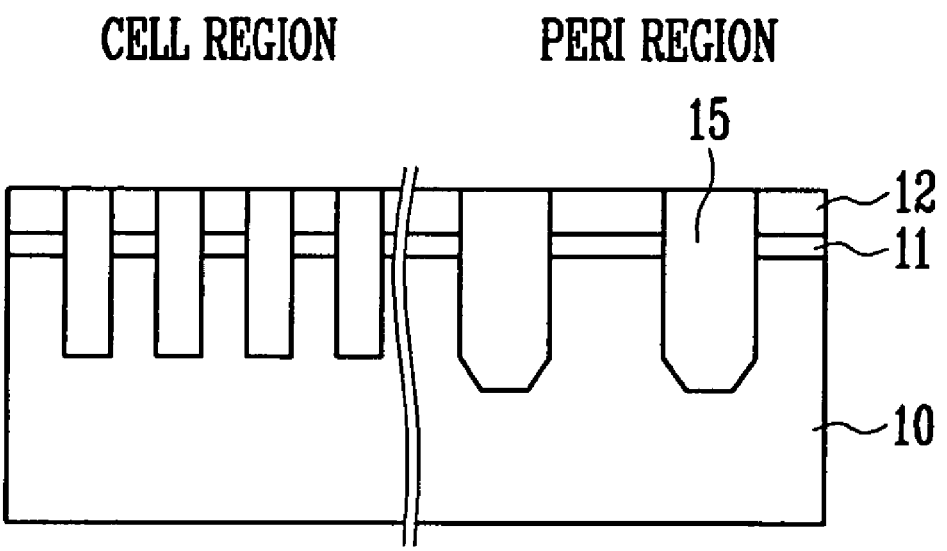

Referring to FIG. 1E, an oxide film is deposited on the entire surface so that the second and third trenches 14a and 14b are completely buried. The oxide film is preferably polished by chemical mechanical polishing (CMP) or another suitable method until the nitride film 12 is exposed, thereby forming an isolation film 15 within the second and third trenches 14a and 14b.

As described above, according to the invention, when trenches for element isolation are formed in the cell region and the peri region at the same time, micro trenches can be prevented from being formed. Accordingly, the invention is advantageous in that it can prevent dislocation depending the concentration of stress on micro trenches and can improve field leakage characteristics.

While the invention has been described in connection with practical exemplary embodiments, the invention is not limited to the disclosed embodiments but, to the contrary, is intended to cover various modifications and equivalent arrangements included within the spirit and scope of the a ended claims.

What is claimed is:

1. A method of forming a trench type isolation film of a semiconductor device, the method comprising:
   sequentially forming a pad oxide film and a nitride film for a hard mask on a semiconductor substrate in which a cell region and a peri region are defined;
   patterning the nitride film in the cell region using an etch process employing a cell array mask, thereby forming a patterned nitride film;
   coating a photoresist on the entire structure including the patterned nitride film of the cell region;
   patterning the photoresist in the peri region using a peri ISO mask, thereby forming a patterned photoresist;
   sequentially etching the nitride film, the pad oxide film, and the semiconductor substrate of the peri region using the patterned photoresist covering the entire cell region as an etch mask, thereby forming first trenches in the peri region;
   stripping the photoresist;
   etching the semiconductor substrate of the cell region and the peri region using the patterned nitride film as an etch mask, thereby forming second trenches in the cell region, the second trenches having a vertical profile within the semiconductor substrate, and third trenches, which are consecutive to the first trenches, in the peri region, the third trenches having a vertical profile and a sloped bottom within the semiconductor substrate; and
   forming an isolation film within the second and third trenches.

2. The method of claim 1, comprising forming the first trenches to have a depth of 1000 Å to 2000 Å.

3. The method of claim 1, wherein the first trenches have a lateral slope due to polymer generated during the etch process.

4. The method of claim 3, comprising controlling an angle of the lateral slope of each of the first trenches by adjusting the pressure, power, and an etch gas of an etch process.

5. A method of forming a trench type isolation film of a semiconductor device, the method comprising:
   forming a nitride film for a hard mask over a semiconductor substrate in which a cell region and a peri region are defined;
   patterning the nitride film in the cell region to expose the semiconductor substrate using a cell array mask, thereby forming a patterned nitride film;
   coating a photoresist on the entire structure including the patterned nitride film of the cell region;
   patterning the photoresist in the peri region, thereby forming a patterned photoresist;
   forming first trenches having a lateral slope in the peri region by etching the nitride film, and the semiconductor substrate of the peri region using the patterned photoresist covering the entire cell region as an etch mask;
   stripping the photoresist;
   forming second trenches having a vertical profile within the semiconductor substrate in the cell region and third trenches, which are consecutive to the first trenches, in the peri region, the third trenches having a vertical profile and a sloped bottom within the semiconductor substrate, by etching the semiconductor substrate of the cell region and the peri region using the patterned nitride film as an etch mask; and
   forming an isolation film within the second and third trenches.

6. The method of claim 5, comprising forming the first trenches to have a depth of 1000 Å to 2000 Å.

7. The method of claim 5, wherein the lateral slope of the first trenches is formed due to polymer generated during the etch process and deposited at the sidewalls of the first trenches.

8. The method of claim 5, comprising controlling an angle of the lateral slope of each of the first trenches by adjusting the pressure, power, and an etch gas of an etch process.

* * * * *